(12) United States Patent
Jung

(10) Patent No.: US 6,812,764 B2
(45) Date of Patent: Nov. 2, 2004

(54) TIMING CONTROL CIRCUIT FOR USE OF A SEMICONDUCTOR DEVICE

(75) Inventor: Tae Hyung Jung, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/238,494

(22) Filed: Sep. 10, 2002

(65) Prior Publication Data

US 2003/0048121 A1 Mar. 13, 2003

(30) Foreign Application Priority Data

Sep. 13, 2001 (KR) .......................................... 2001-56503

(51) Int. Cl.[7] .............................................. H03H 11/26
(52) U.S. Cl. ...................................... 327/262; 327/263
(58) Field of Search ................................ 327/261, 262, 327/263, 264, 269, 270, 271, 276, 277, 281, 172, 176

(56) References Cited

U.S. PATENT DOCUMENTS

| | | | | | |
|---|---|---|---|---|---|
| 5,428,311 A | * | 6/1995 | McClure | .................... | 327/276 |
| 5,726,585 A | * | 3/1998 | Kim | .............................. | 326/38 |
| 5,852,379 A | * | 12/1998 | Jiang | ........................... | 327/176 |
| 6,188,255 B1 | * | 2/2001 | Mann | .......................... | 327/113 |
| 6,239,642 B1 | * | 5/2001 | Kim et al. | .................. | 327/276 |
| 6,347,394 B1 | * | 2/2002 | Ochoa et al. | .................. | 716/6 |
| 6,441,665 B1 | * | 8/2002 | Hashidate et al. | .......... | 327/270 |
| 6,643,789 B2 | * | 11/2003 | Mullarkey | .................. | 713/401 |
| 6,653,877 B2 | * | 11/2003 | Tsujino | ....................... | 327/161 |

* cited by examiner

Primary Examiner—Tuan T. Lam
(74) Attorney, Agent, or Firm—Ladas & Parry LLP

(57) ABSTRACT

Disclosed is a timing control circuit for semiconductor device capable of controlling timing of internal signal after packaging by using a fuse. The disclosed comprises: a signal delay unit comprising delay elements and for delaying externally received signal for a predetermined time and outputting the result; and a fuse unit capable of determining whether to enable or disable after packaging the semiconductor device and then, determining whether to delay the signal by the delay element or not according to whether it is enabled or not, thereby controlling delay time of signal by the signal delay unit.

3 Claims, 4 Drawing Sheets

TIMING CONTROL CIRCUIT FOR USE OF A SEMICONDUCTOR DEVICE

BACKGROUND OF THE INVENTION

1. Field of the Invention

The present invention relates to a timing control circuit for a semiconductor memory device and, more particularly, to a circuit capable of controlling timing before and after package by using a fuse.

2. Description of the Related Art

As shown in FIG. 1, a delay set using metal mask has been employed to control signal timing in a semiconductor device. FIG. 1 is an exemplary circuit diagram of a circuit generating a signal delay necessary for active and precharge modes according to the level of signal A applied to input terminal.

The conventional timing control circuit comprises: a delay unit 10 including a plurality of delay means, for example, a first delay means 11 and a second delay means 13 connected in a row; a metal switching means 20 formed by using a metal mask in a semiconductor process to determine whether the second delay means 13 is employed or not; and a signal transmission unit 30 for receiving signal controlled by the delay unit 10 and the metal switching means 20 and then, outputting a timing controlled signal.

The signal transmission unit 30 comprises: a NAND gate NAND for receiving signal according to the connected state of the second delay means 13 and the metal switching means 20; a first inverter INV1 for inverting signal from the NAND gate; a first NOR gate NOR1 for receiving signal from the first delay means 11 and the first inverter INV1; a second inverter INV2 for inverting signal from the first NOR gate NOR1; and a second NOR gate NOR2 for receiving the externally-inputted signal and signal from the second inverter INV and then, outputting timing controlled signal of the externally-inputted signal by each delay means. The metal switching means 20 operates as a switching to connect the second delay means 13 with the first NAND gate NAND 1 or the first NAND gate NAND 1 with ground. That is, when the metal switching means 20 is connected with ground, timing of externally-inputted signal is controlled only by the first delay means 11 and when the metal switching means 20 connects the second delay means 13 with the first NAND gate NAND 1, timing of externally-inputted signal is controlled by the first and the second delay means 11, 13.

However, conventional timing control circuit using the metal switching means 13 has a problem that delay time is increased or reduced by process variables after manufacturing and packaging products. And, it is difficult to solve problems generated by undesirable timing, for example, problems generated on the ground that tRCD, tRP or other timing spec. is not satisfied.

SUMMARY OF THE INVENTION

Therefore, the present invention has been made to solve the above-mentioned problems and a primary objective of the present invention is to provide a timing control circuit for semiconductor device satisfying timing specification by enabling timing of internal signal to be controlled after packaging the semiconductor device.

In order to accomplish the above objective, a timing circuit of the present invention includes a signal delay unit comprising delay elements and for delaying externally-received signal for a predetermined time and then, outputting the result and a fuse unit capable of determining whether to enable or disable semiconductor device after packaging, and determining whether to delay signal or not by the delay element according to whether it is enabled or disabled, thereby controlling delay time of signal by the signal delay unit.

The fuse unit desirably comprises electrical fuse circuit blowing through current. And, the electrical fuse circuit includes a fuse comprising: a first node; a MOS transistor wherein source voltage VDD is applied to on channel terminal, a signal for fuse program is applied to gate, and other channel terminal is connected with the first node; a fuse wherein one end is connected with the first node and other end is applied with a predetermined level of control voltage VSB; and resistor wherein one end is connected with the first node and other end is applied with source voltage VDD.

More desirably, the electrical fuse circuit further includes a first inverter whose input terminal is connected with other channel terminal of the MOS transistor; and a second inverter whose input terminal is connected with output terminal of the first inverter, the output signal determining whether to delay signal by the delay element or not. And, more desirably, the electrical fuse circuit further includes a latch unit whose input terminal is connected to output terminal of the second inverter and the source voltage VDD is applied as the control voltage VSB after level of the first node is latched to the latch unit.

The fuse unit comprises two or more electrical fuse circuits, wherein at least one of them is employed to reduce signal delay time by the signal delay unit and at least one of them to increase signal delay time by the signal delay unit.

According to timing control circuit of the present invention, it is possible to control timing of internal signal after packaging semiconductor device, thereby satisfying timing specification. Therefore, the present invention is effective in improving productivity and quality in spite of process variables.

BRIEF DESCRIPTION OF THE DRAWINGS

The above objects, and other features and advantages of the present invention will become more apparent after reading the following detailed description when taken in conjunction with the drawings.

DETAILED DESCRIPTION OF THE INVENTION

Figure 1:
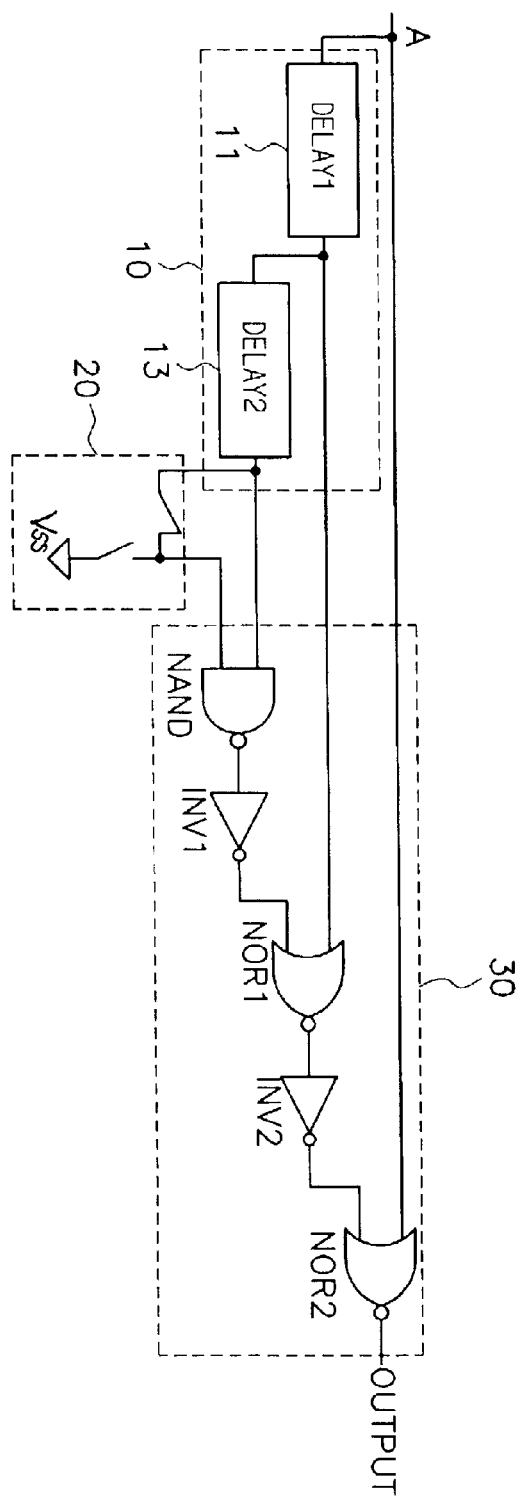
FIG. 1 is a circuit diagram of conventional timing control circuit for semiconductor memory device.
Figure 2:
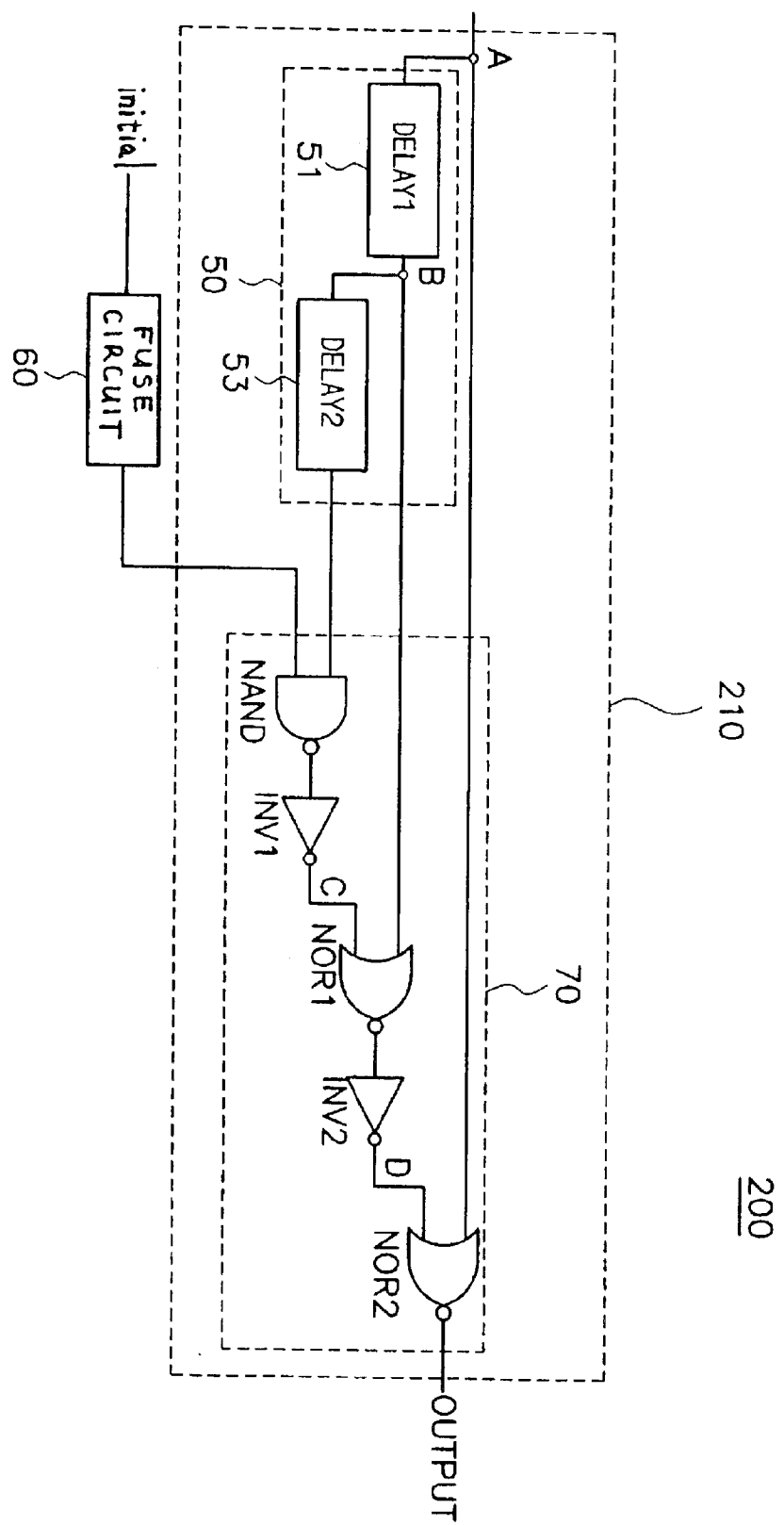
FIG. 2 is a circuit diagram of timing control circuit for semiconductor memory device according to one embodiment of the present invention.
Figure 3:
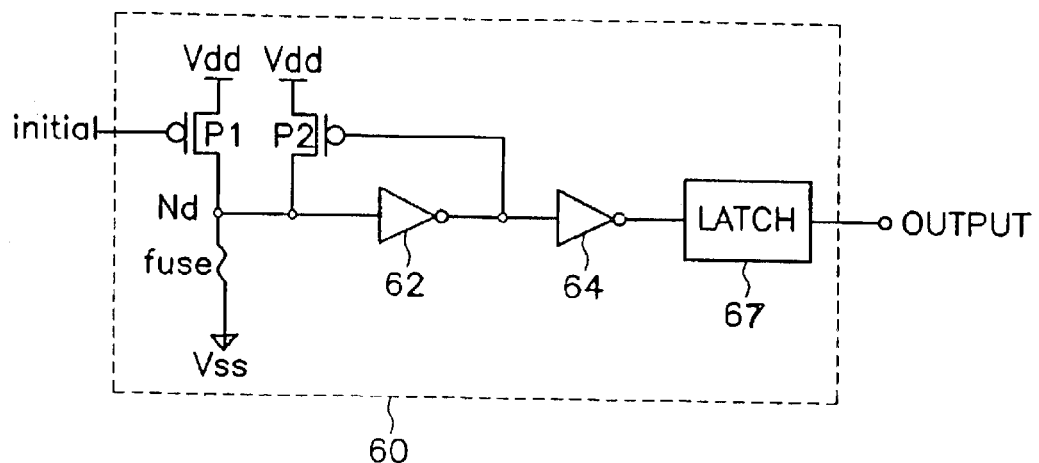
FIG. 3 is a circuit diagram of fuse circuit in FIG. 2.
Figure 4:
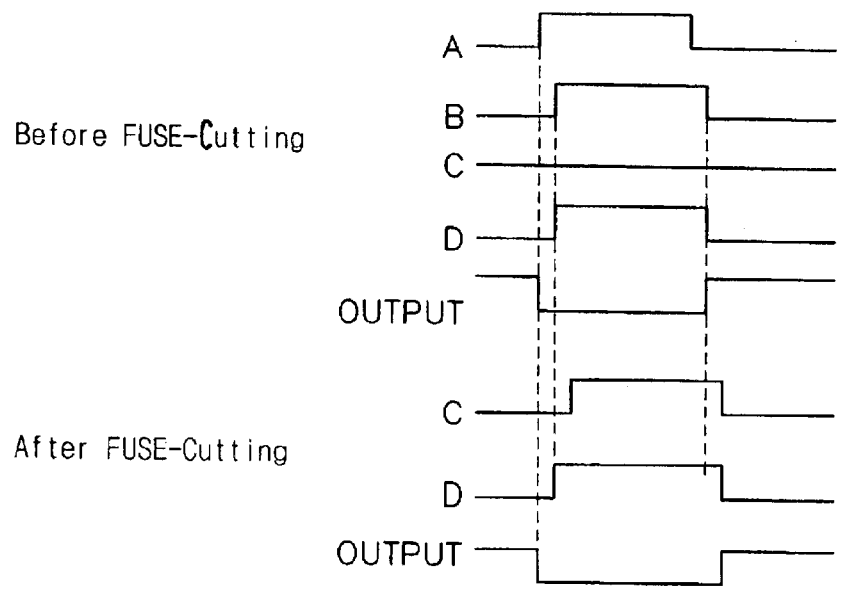
FIG. 4 is an operation timing graph of FIG. 2.

FIG. 2 is a circuit diagram according to one embodiment of the present invention, FIG. 3 is an operation timing graph of FIG. 2 and FIG. 4 is a circuit diagram according to another embodiment of the present invention.

Referring to FIG. 2, a timing control circuit 200 comprises a fuse circuit 60 and a signal delay unit 210. The signal delay unit 210 comprises a delay unit 50 including a plurality of delay means, for example, a first delay means 51 and a second delay means 53 connected in a row for delaying external control signal A and controlling timing, and a signal transmission unit 70 for receiving signal controlled by the delay unit 50 and the fuse circuit 60 and then, outputting timing controlled signal. In FIG. 2, the fuse circuit 60 controls timing control by the second delay means 53 in combination with the second delay means 53 of delay unit 50.

The signal transmission unit 70 comprises: a NAND gate NAND for receiving signal according to connected state of the second delay means 53 and the fuse circuit 60; a first inverter INV1 for inverting signal from the NAND gate NAND; a first NOR gate NOR1 for receiving signal from the first delay means 51 and the first inverter INV1; a second inverter INV2 for inverting signal from the first NOR gate NOR1; and a second NOR gate NOR 2 for receiving the externally-controlled signal A and signal from the second inverter INV and then, outputting timing controlled signal OUTPUT of externally-outputted signal by each delay means.

Referring to FIG. 3, the fuse circuit 60 may employ a laser cutting fuse. The fuse circuit 60 comprises: a first PMOS transistor P1 for transmitting the source voltage Vdd to output node Nd by an initial input value applied to the gate of P1; a fuse connected between the output node Nd and the ground; an inverter 64 for inverting electrical potential of the output node Nd; a second PMOS transistor P2 for transmitting the source voltage Vdd to the output node Nd by a signal from the inverter 62; and an inverter 64 for inverting an output signal of the inverter 62. And preferably, a latch unit 67 is connected to the output terminal of the inverter 64. And the source voltage Vdd is provided as the "OUTPUT" of the fuse circuit 60 to the signal transmission unit 70 as the control voltage, for example, Vsb which is the voltage between the source terminal of P1 or P2 and the substrate, after the level of the first node is latched to the latch unit 67.

Before cutting the fuse circuit 60, input of the first NAND gate NAND1 becomes 'low' level and output from the first NOR gate NOR 1 becomes 'high' level, thereby having no influence on output of the first NOR gate NOR1. After cutting the fuse circuit 60, output of the first NAND gate NAND 1 becomes 'high' level and output of the first NAND gate NAND 1 is changed according to output of the second delay means 53 thereby, output of the first NOR gate NOR1 is also changed.

FIG. 4 shows an operation timing before and after fuse cutting. In FIG. 4, A is an externally-controlled signal, B is an output signal of first delay means 51, C is an output signal of first inverter INV1 and D is an output signal of second inverter INV2.

Before fuse cutting, output of second delay means 53 is not employed and after fuse cutting, output of second delay means 53 is employed, thereby extending timing of output signal of second NOR gate NOR2.

In the above embodiment, the first delay means 51, the second delay means 53 and one fuse circuit 60 are employed as timing control means, however, it is possible to use a plurality of delay means, for example, the first to the third delay means and the first and the second fuse circuits to control timing of output signal.

Figure 5:
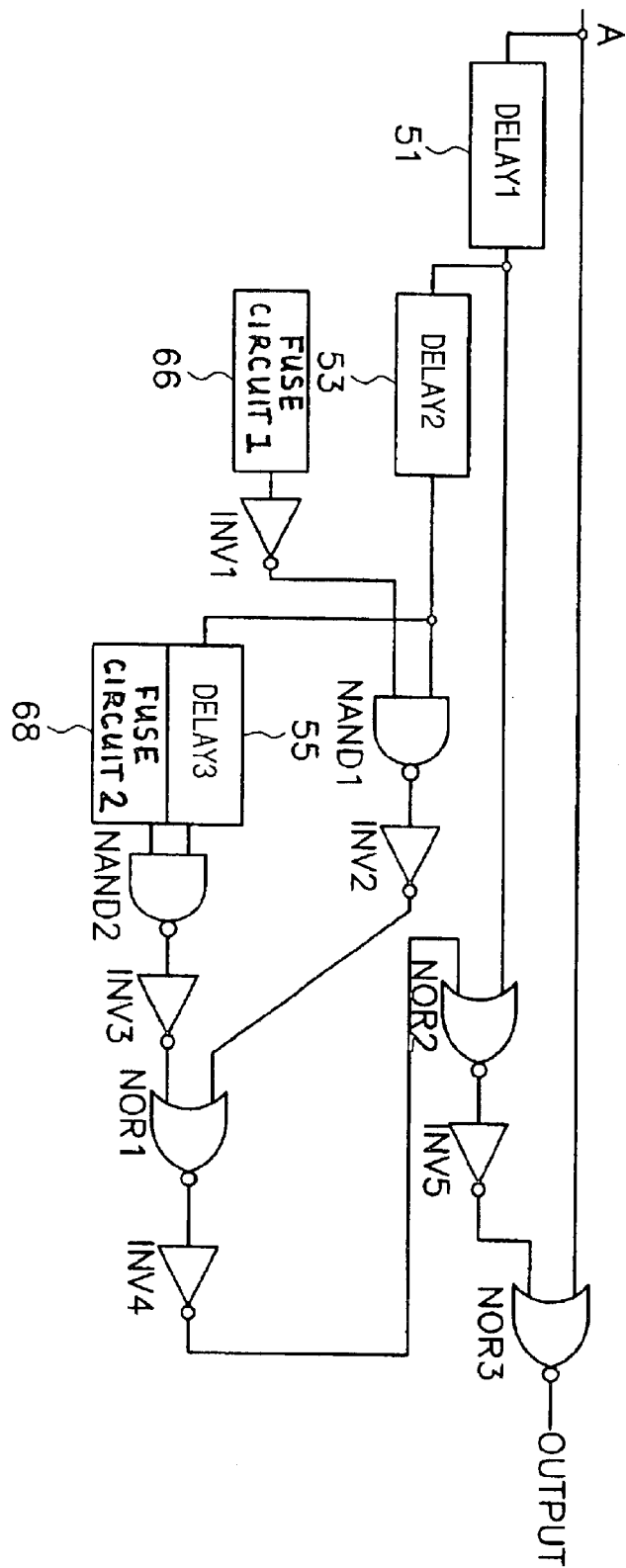
FIG. 5 is a circuit diagram according to another embodiment of the present invention.

Referring to FIG. 5, the circuit comprises: a first inverter INV1 for inverting signal from the first fuse circuit 66; a first NAND gate NAND1 for receiving signal from second delay means 53 and first inverter INV1; a second NAND gate NAND2 for receiving signal from third delay means 55 and second fuse circuit 68; a second inverter INV2 and a third inverter INV3 for inverting signals from first NAND gate NAND1 and second NAND gate NAND2, respectively; a first NOR gate NOR1 for receiving signal from second inverter INV2 and third inverter INV3; a fourth inverter INV4 for inverting signal from first NOR gate NOR1; a second NOR gate NOR2 for receiving signal from first delay means 51 and fourth inverter INV4; a fifth inverter INV5 for inverting signal from second NOR gate NOR2; and a third NOR gate NOR3 for receiving externally-controlled signal A and signal from fifth inverter INV5 and then, outputting timing controlled signal of the externally-controlled signal A by the first to the third delay means 51,53,55.

In the above embodiment, laser cutting fuse is employed to control timing before package. However, it is also possible to employ electrical fuse controlling timing through current, thereby fabricating products satisfying desirable timing specification after package.

As described above, according to an embodiment of the present invention, a plurality of fuse circuits 66, 68 may be employed instead of the conventional metal switching means 20, thereby controlling the timing to tRCD, tRP or to a desirable timing specification set according to the process variables after the wafer fabrication or after the packaging. These flexibilities afforded in design and the accompanying advantages of the present invention effectively leads to improvements in the product quality and productivity.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A timing circuit for semiconductor device comprising:
   a signal delay unit for delaying an externally received signal for a delay time and outputting a delayed signal, the signal delay unit comprising:
   a first delay means having a first delay input and a first delay output;
   a second delay means having a second delay input connected to the first delay output and a second delay output;
   a third delay means having a third delay input connected to the second delay output and a third delay output; and
   a first fuse circuit having a first fuse and being capable of receiving a first enabling signal and, when the first fuse circuit is enabled and the first fuse is cut, being capable of controlling the delay time of the signal delay unit, wherein the first fuse circuit comprises:
   a first node;
   a first PMOS transistor having a first source terminal, a first drain terminal, and a first gate terminal, wherein a source voltage VDD is applied to the first source terminal, a signal for a fuse program is applied to the first gate terminal, and the first drain terminal is connected to the first node;
   the first fuse having a first fuse end connected to the first node and the second fuse end connected to an electrical ground; and
   a second PMOS transistor having a second source terminal, a second drain terminal, and a second gate terminal, wherein the second drain terminal is connected to the first node and the second source terminal is connected to the source voltage VDD;

a first inverter having a first input terminal and a first output terminal; and a second inverter having a second input terminal and a second output terminal, wherein the first input terminal is connected to the first node, wherein the first output terminal is connected to the second input terminal, wherein the first output terminal is also connected to the second gate terminal, and wherein the second output terminal outputs a first fuse circuit output signal for determining the delay time;

a second fuse circuit having a second fuse and being capable of receiving a second enabling signal and, when the second fuse circuit is enabled and the second fuse is cut, being capable of controlling the delay time of the signal delay unit, wherein the second fuse circuit comprises:

a second node;

a third PMOS transistor having a third source terminal, a third drain terminal, and a third gate terminal, wherein a source voltage VDD is applied to the third source terminal, a signal for a fuse program is applied to the third gate terminal, and the third drain terminal is connected to the second node;

the second fuse having a third fuse end connected to the second node and the fourth fuse end connected to an electrical ground; and a fourth PMOS transistor having a fourth source terminal, a fourth drain terminal, and a fourth gate terminal, wherein the fourth drain terminal is connected to the second node and the fourth source terminal is connected to the source voltage VDD;

a third inverter having a third input terminal and a third output terminal; and a fourth inverter having a fourth input terminal and a fourth output terminal, wherein the third input terminal is connected to the second node, wherein the third output terminal is connected to the fourth input terminal, wherein the third output terminal is also connected to the fourth gate terminal, and wherein the fourth output terminal outputs a second fuse circuit output signal for determining the delay time; and a signal transmission unit comprising:

an INV1 inverter having an input to receive the first fuse circuit output signal;

a NAND1 nand gate for receiving the second delay output and the output signal of the INV1 inverter;

an INV2 inverter having an input to receive the output signal of the NAND1 nand gate;

a NAND2 nand gate for receiving the signal from the third delay means output and the second fuse circuit output signal;

an INV3 inverter for receiving the output of the NAND2 nand gate;

a NOR1 nor gate for receiving the outputs of the INV2 inverter and the INV3 inverter;

an INV4 inverter for receiving the output of NOR1 nor gate;

a NOR2 nor gate for receiving the output signal of the INV4 inverter and the first delay means output signal;

an INV5 inverter for receiving the output of the NOR2 nor gate; and a NOR3 nor gate for receiving the externally received signal and the output signal of INV5 inverter; and outputting the delayed signal.

2. The timing circuit of claim 1, wherein the first fuse circuit further comprises:

a first latch unit whose input terminal is connected to the output terminal of the second inverter, wherein the source voltage VDD is applied as a control voltage VSB after level of the first node is latched to the latch unit.

3. The timing circuit of claim 1, wherein the second fuse circuit further comprises:

a second latch unit whose input terminal is connected to the output terminal of the fourth inverter, wherein the source voltage VDD is applied as a control voltage VSB after level of the second node is latched to the latch unit.

* * * * *